US012628298B2

(12) United States Patent
Liu

(10) Patent No.: US 12,628,298 B2
(45) Date of Patent: May 12, 2026

(54) LED DISPLAY DEVICE WITH HIGHLY EFFECTIVE INSTALLATION

(71) Applicants:SHENZHEN AI INTELLIGENT DISPLAY TECHNOLOGY CO., LTD., Shenzhen (CN); SHENZHEN NEWLIGHT TECHNOLOGY CO., LTD., Shenzhen (CN); SHENZHEN LIMEI OPTOELECTRONICS CO., LTD., Shenzhen (CN)

(72) Inventor: Xiaohui Liu, Shenzhen (CN)

(73) Assignees: SHENZHEN AI IDT CO., LTD. (CN); SHENZHEN NT CO., LTD. (CN); SHENZHEN LO CO., LTD. (CN)

( * ) Notice: Subject to any disclaimer, the term of this patent is extended or adjusted under 35 U.S.C. 154(b) by 192 days.

(21) Appl. No.: 18/661,764

(22) Filed: May 13, 2024

(65) Prior Publication Data

US 2024/0389243 A1     Nov. 21, 2024

(30) Foreign Application Priority Data

May 15, 2023    (CN) ......................... 202310546186.X

(51) Int. Cl.
*H05K 5/30*         (2025.01)
*H05K 5/02*         (2006.01)

(52) U.S. Cl.
CPC ............. *H05K 5/30* (2025.01); *H05K 5/0217* (2013.01)

(58) Field of Classification Search
CPC ........ H05K 5/30; H05K 5/0217; G09F 9/302; G09F 9/33; G09F 9/3026; Y02D 10/00; F16B 35/00; F16B 37/00
See application file for complete search history.

(56) References Cited

U.S. PATENT DOCUMENTS

| | | | | |
|---|---|---|---|---|
| 2015/0277491 A1* | 10/2015 | Browning | ............. | G06F 1/1632 |
| | | | | 248/346.03 |
| 2015/0293389 A1* | 10/2015 | Zhang | ............... | G02F 1/133308 |
| | | | | 349/73 |
| 2016/0316578 A1* | 10/2016 | Cha | ........................... | G02B 5/08 |
| 2019/0166704 A1* | 5/2019 | Shin | ..................... | H05K 5/0217 |
| 2021/0157371 A1* | 5/2021 | Mori | ..................... | G09F 9/3026 |

FOREIGN PATENT DOCUMENTS

| | | | | | |
|---|---|---|---|---|---|
| CN | 109505835 A | * | 3/2019 | ................ | F16B 5/02 |
| CN | 110966285 A | * | 4/2020 | ............. | F16B 35/02 |

* cited by examiner

*Primary Examiner* — Abhishek M Rathod
*Assistant Examiner* — Keon Kim

(57)         ABSTRACT

The invention presents an LED display device featuring a highly efficient installation method. It consists of display screens arranged in a matrix, with adjacent screens connected via a rapid assembly. This assembly includes a motor screw structure affixed to one screen and a nut structure fixed to the adjacent screen. The motor screw structure incorporates a deceleration motor and a screw fixed on the screen, while the nut structure comprises a nut fixed on the screen via a mounting plate. During assembly, power is applied only after alignment, allowing the deceleration motor to rotate the screw. The nut then adjusts the distance between screens until installation requirements are met, enhancing installation efficiency.

6 Claims, 2 Drawing Sheets

LED DISPLAY DEVICE WITH HIGHLY EFFECTIVE INSTALLATION

TECHNICAL FIELD

The invention relates to the technical field of LED display equipment, in particular to an LED display device with a highly effective installation.

BACKGROUND ART

The LED display device is an electronic display device composed of LED lattices, it changes the screen display content forms such as text, animation, pictures, and video by turning on and off the red and green lights, thereby realizing the transformation between different forms of various information presentation modes, and it can be used indoors and outdoors, which has incomparable advantages over other display devices. With the advantages of high brightness intensity, low power consumption, low voltage demand, small and portable size, long service life, stable impact resistance, and strong resistance to external interference, it has developed rapidly and is widely used in various fields.

At the same time, with the development of scientific and technological information, the progress of video technology has been promoted, and the screen display of video has been widely used in outdoor advertising, public transportation, publicity exhibitions, and other fields. In order to increase the publicity effect, multiple display screens need to be assembled together to realize the video display of the same screen.

The existing multiple display screens are generally fixed to a specific position of the same installation frame by manual operation, this fixation method has the following defects: (1) Low installation efficiency, the installation speed of general conventional LED display equipment is about 1 m2/37 minutes; (2) The installation accuracy should be strictly controlled. Once a large error appears, it will cause some display screens to exceed the installation frame, resulting in unstable installation; (3) After the installation is completed, the distance between the adjacent display screens cannot be adjusted according to the needs of customers, and the use is not flexible.

SUMMARY

In order to solve the above problems, the invention provides an LED display device with a highly effective installation, which connects two adjacent display screens through a fast assembly, during the assembly, the power supply is turned on only after alignment, and the deceleration motor can drive the screw to rotate, the distance between the two display screens can be shortened with the nut until the installation requirements are met, which improves the installation efficiency.

In order to achieve the above purpose, the invention provides a LED display device with a highly effective installation, comprising display screens distributed in a matrix, adjacent two display screens are connected via a fast assembly, and the fast assembly comprises a motor screw structure fixed on one of the display screens and a nut structure of fixed on the adjacent display screen;

the motor screw structure comprises a deceleration motor and a screw fixed on the display screen, an output shaft of the deceleration motor is connected to one end of the screw through a mounting sleeve fixed on the display screen;

the nut structure comprises a nut fixed on the display screen through a mounting plate, and the nut is connected to the other end of the screw.

Preferably, the screw is provided with an axial moving groove at one end that faces the deceleration motor, the output shaft of the deceleration motor is fixed with a telescopic head, the telescopic head extends into the axial moving groove and is in a sliding connection with the axial moving groove, the telescope head limits a degree of freedom in a circumferential direction of the axial moving groove.

Preferably, the telescopic head is a flat tip or a D-shaped tip, and the axial moving groove is a flat groove or a D-shaped groove adapted to the telescopic head.

Preferably, the output shaft between the screw and the deceleration motor is sleeved with a compression spring for pressing the screw to the nut.

Preferably, a depth of the axial moving groove is greater than a length of the screw extending out of the mounting sleeve, which is used to facilitate the screw completely shrinking into an interior of the mounting sleeve during installation, so as to facilitate an alignment of display screens on a same horizontal line.

Preferably, both ends of relative sides of the display screens are fixed with the motor screw structure, and both ends of the relative sides are fixed with the nut structure.

Preferably, the deceleration motor, the mounting sleeve, and the mounting plate are all fixed inside the display screen by screws.

Preferably, the deceleration motor is electrically connected via a power cord with a 12V DC power supply for the display screen.

Preferably, the deceleration motor comprises a 12V motor and a reducer connected to an output end of the 12V motor, and the output end connected to the reducer is connected to the output shaft.

The invention has the following beneficial effects:

Saving resources, the conventional LED display screen fixation requires setting up a steel structure on the back of the device, which is fixed by the way that the display device is installed in the steel structure, the invention eliminates the steel structure in the back to achieve the purpose of saving resources.

Reducing labor costs, the installation personnel is reduced.

Improving the installation efficiency, the installation speed of the general conventional LED display device is about 1 m2/37 minutes, according to the experimental test of the invention, the installation speed is 1 m2/5 minutes, which greatly improves the installation efficiency.

The following is a further detailed description of the technical solution of the invention through drawings and embodiment.

Figure 1:
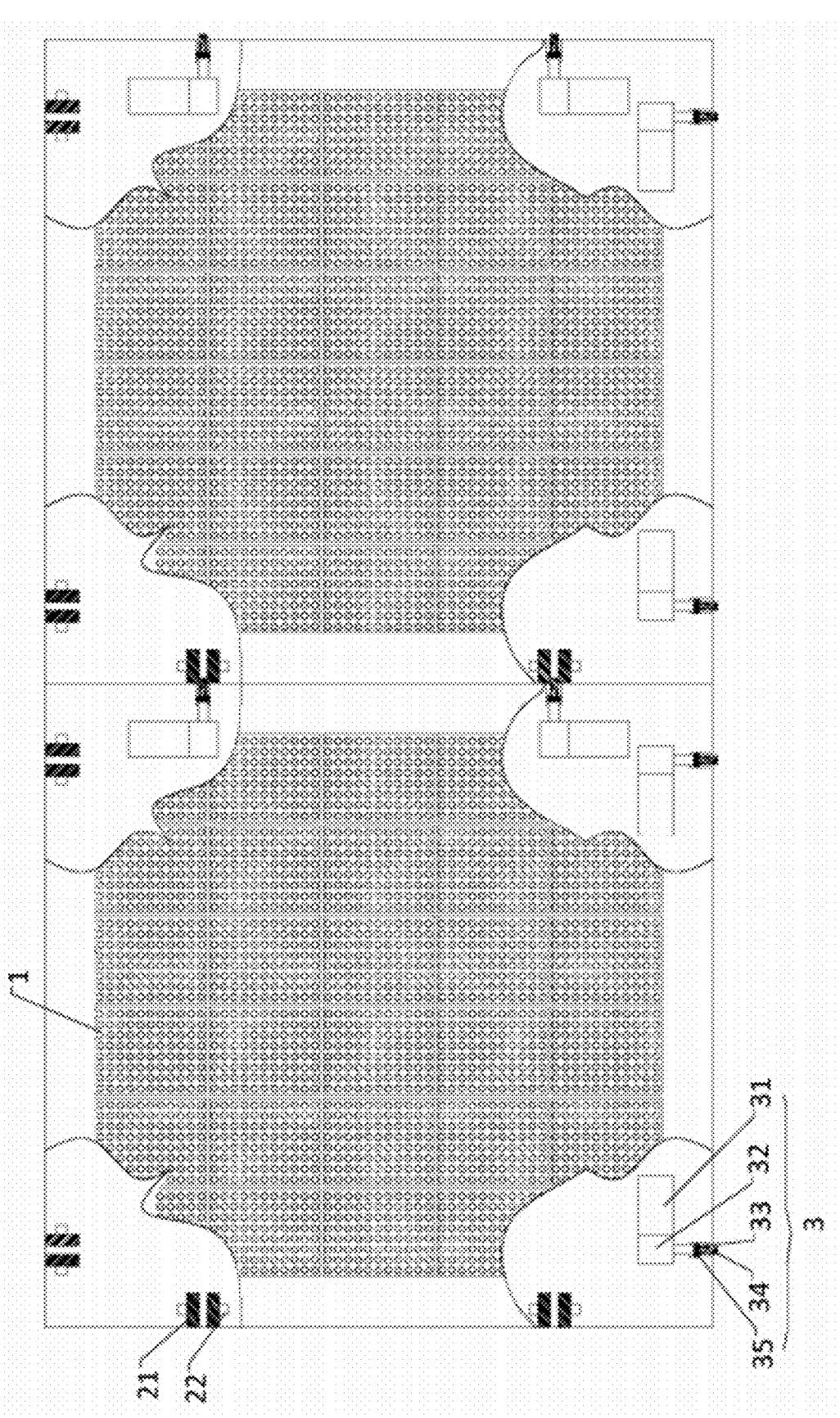
FIG. 1 is a structural diagram of the LED display device with a highly effective installation in the invention.

Among them: 1, display screen;

2, nut structure; 21, nut; 22, mounting plate;

3, motor screw structure; 31, 12V motor; 32, reducer; 33, compression spring; 34, screw; 35, mounting sleeve; 36, axial moving groove; 37, telescopic head; 38, output shaft.

DETAILED DESCRIPTION OF THE EMBODIMENTS

In order to make the purpose, technical solution, and advantages of the disclosure of the embodiment of the invention more clear, the embodiment of the invention is further described in detail in combination with the attached drawings. It should be understood that the specific embodiment described here is only used to explain the embodiment of the invention, and is not used to limit the embodiments of the invention. Based on the embodiment in this application, all other implementation examples obtained by ordinary technical personnel in this field without making creative work belong to the scope of protection in this application. An example of the embodiments is shown in the accompanying figures, where the same or similar labels from beginning to end represent the same or similar components or components with the same or similar functions.

It should be noted that the terms 'comprise' and 'comprising' and any deformation of them are intended to cover non-exclusive inclusion, for example, a process, method, system, product, or server that contains a series of steps or units need not be limited to those steps or units that are listed, but may comprise other steps or units that are not listed or are inherent to those processes, methods, products or equipment.

Similar labels and letters represent similar items in the following figures. Therefore, once an item is defined in a figure, it does not need to be further defined and explained in the following figures.

In the description of the invention, it is necessary to explain that the orientation or positional relationship indicated by the terms 'up', 'down', 'inside', 'outside', etc. is based on the orientation or positional relationship shown in the attached figures, or is the orientation or positional relationship that is habitually placed when the invention product is used, only to facilitate the description of the invention and simplify the description, rather than to indicate or imply that the device or component referred to must have a specific orientation, be constructed and operated in a specific orientation, and therefore cannot be understood as a limitation to the invention.

In the description of the invention, it is also necessary to explain that, unless otherwise clearly defined and limited, the terms 'set', 'install', and 'connect' should be understood in a broad sense, for example, it can be fixed connection, detachable connection, or integrated connection; it can be mechanical connection or electrical connection; it can be directly connected or indirectly connected through an intermediate medium, which can be the internal connection of two components. For ordinary technicians in this field, the specific meaning of the above terms in this invention can be understood in detail.

Figure 2:
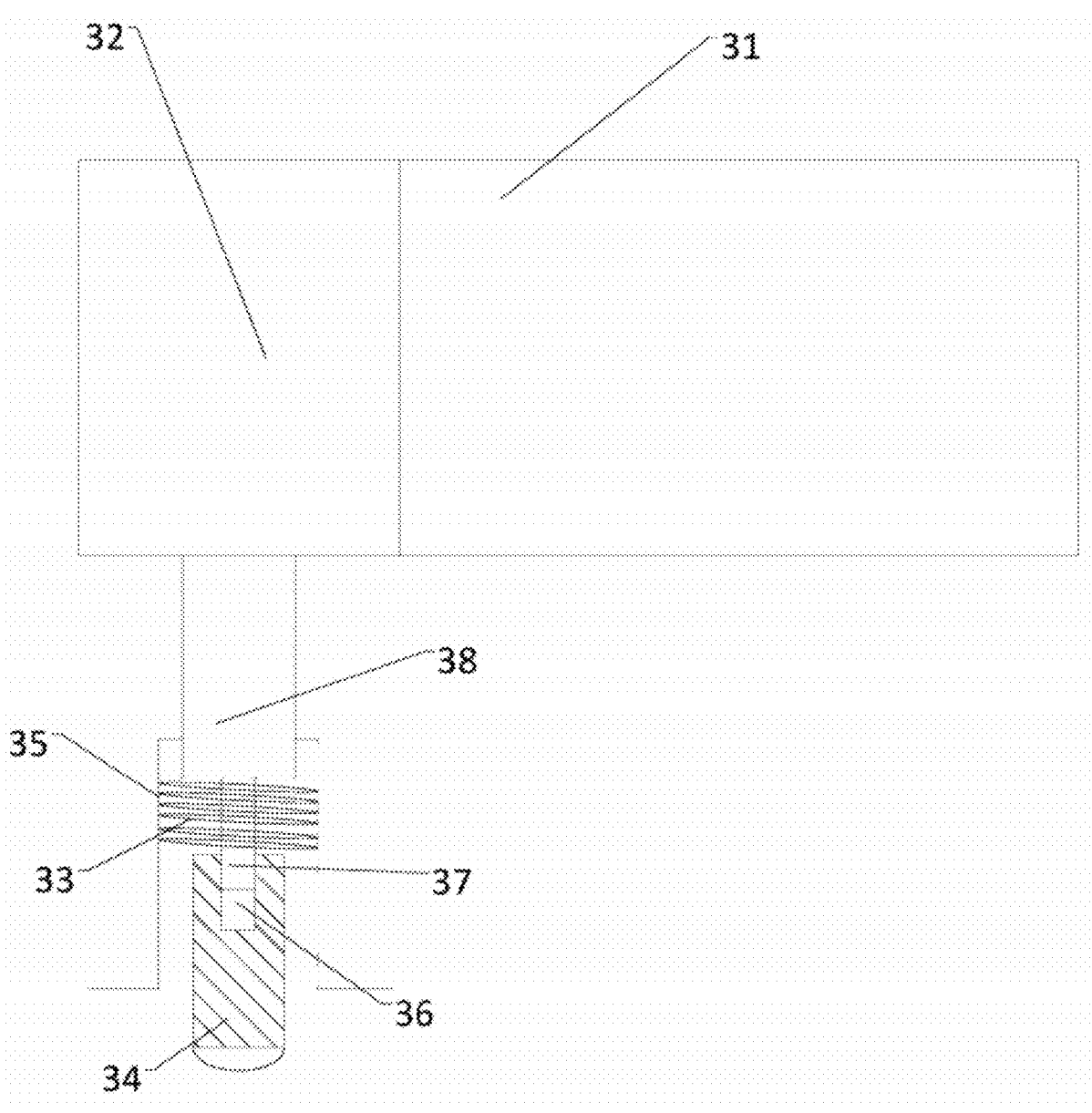
FIG. 2 is a schematic diagram of the motor screw structure for the LED display device with a highly effective installation.

FIG. 1 is a structural diagram of the LED display device with a highly effective installation in the invention. It needs to be explained that FIG. 1 is a partial section view. As shown in FIG. 1, the LED display device with a highly effective installation, comprising display screens 1 distributed in a matrix, the adjacent two display screens 1 are connected via a fast assembly, and the fast assembly comprises a motor screw structure fixed on one of the display screens 1 and a nut structure of fixed on the adjacent display screen 1;

FIG. 2 is a schematic diagram of the motor screw structure for the LED display device with a highly effective installation. As shown in FIG. 2, the motor screw structure comprises a deceleration motor and a screw 34 fixed on the display screen 1, the output shaft 38 of the deceleration motor is connected to one end of the screw 34 through a mounting sleeve 35 fixed on the display screen;

the nut structure 2 comprises a nut 21 fixed on the display screen 1 through a mounting plate 22, and the nut 21 is connected to the other end of the screw 34.

Preferably, the screw 34 is provided with an axial moving groove 36 at one end that faces the deceleration motor, the output shaft 38 of the deceleration motor is fixed with a telescopic head 37, the telescopic head 37 extends into the axial moving groove 36 and is in a sliding connection with the axial moving groove 36, the telescope head limits the degree of freedom in the circumferential direction of the axial moving groove 36. Preferably, the telescopic head 37 is a flat tip or a D-shaped tip, and the axial moving groove 36 is a flat groove or a D-shaped groove adapted to the telescopic head 37.

Preferably, the output shaft 38 between the screw 34 and the deceleration motor is sleeved with a compression spring 33 for pressing the screw 34 to the nut 21.

Preferably, the depth of the axial moving groove 36 is greater than the length of the screw 34 extending out of the mounting sleeve 35, which is used to facilitate the screw 34 to completely shrink into the interior of the mounting sleeve 35 during installation, so as to facilitate the alignment of multiple display screens 1 on the same horizontal line.

The following content is realized through the above structure, during the installation, the display screens 1 located on the same horizontal line are aligned first, during the alignment process, the screw 34 is completely pressed into the interior of the mounting sleeve 35 (the telescopic head 37 moves in the axial moving groove 36, at the same time, the compression spring 33 is compressed), which is convenient for alignment, after the alignment is completed, the motor screw structure 3 is aligned with the nut structure 2. At this time, the screw 34 is pressed to the nut 21 under the action of restoring force of the compression spring 33. In this embodiment, the screw 34 is just pressed inside the nut 21, and then the deceleration motor is started, the deceleration motor drives the screw 34 to rotate, and the thread on the inner wall of the nut 21 can be locked, thereby reliably connecting the two display screens 1; the screw 34 is reversely rotated to separate the two adjacent display screens 1, thereby facilitating disassembly.

Preferably, both ends of the relative sides of the display screens 1 are fixed with the motor screw structure 3, and both ends of the relative sides are fixed with the nut structure 2.

Preferably, the deceleration motor, the mounting sleeve 35, and the mounting plate 22 are all fixed inside the display screen 1 by screws, which does not affect the appearance of the display screen 1.

Preferably, the deceleration motor is electrically connected via a power cord with a 12V DC power supply for the display screen 1. Preferably, the deceleration motor comprises a 12V motor 31 and a reducer 32 connected to the output end of the 12V motor 31, and the output end connected to the reducer 32 is connected to the output shaft 38.

Therefore, the invention adopts the above-mentioned structure for the LED display device with a highly effective installation, which connects two adjacent display screens through a fast assembly, during the assembly, the power supply is turned on only after alignment, and the deceleration motor can drive the screw to rotate, the distance between the two display screens can be shortened with the nut until the installation requirements are met, which improves the installation efficiency.

Finally, it should be noted that the above embodiment is only used to explain the technical solution of the invention rather than to restrict it. Although the invention is described in detail concerning the better embodiment, ordinary technicians in this field should understand that they can still modify or replace the technical solution of the invention, and these modifications or equivalent replacements cannot make the modified technical solution out of the spirit and scope of the technical solution of the invention.

What is claimed is:

1. A LED display device with a highly effective installation, comprising display screens distributed in a matrix, adjacent two display screens are connected via a fast assembly, and the fast assembly comprises a motor screw structure fixed on one of the display screens and a nut structure of fixed on the adjacent display screen; the motor screw structure comprises a deceleration motor and a screw fixed on the display screen, an output shaft of the deceleration motor is connected to one end of the screw through a mounting sleeve fixed on the display screen; the nut structure comprises a nut fixed on the display screen through a mounting plate, and the nut is connected to the other end of the screw; the screw is provided with an axial moving groove at one end that faces the deceleration motor, the output shaft of the deceleration motor is fixed with a telescopic head, and the telescopic head extends into the axial moving groove and is in a sliding connection with the axial moving groove, the telescope head limits a degree of freedom in a circumferential direction of the axial moving groove;

the output shaft between the screw and the deceleration motor is sleeved with a compression spring for pressing the screw to the nut; a depth of the axial moving groove is greater than a length of the screw extending out of the mounting sleeve, which is used to facilitate the screw to completely shrink into an interior of the mounting sleeve during installation, so as to facilitate an alignment of display screens on a same horizontal line; during an installation, aligning the display screens located on the same horizontal line first, during an alignment process, pressing the screw completely into the interior of the mounting sleeve, which is convenient for the alignment, after the alignment is completed, aligning the motor screw structure with the nut structure; at this time, pressing the screw to the nut under an action of a restoring force of the compression spring, and then starting the deceleration motor, driving the screw to rotate by the deceleration motor, and locking the nut by using a thread on an inner wall, thereby reliably connecting the two display screens; reversely rotating the screw to separate the two adjacent display screens, thereby facilitating disassembly.

2. The LED display device with the highly effective installation according to claim 1, wherein a telescopic head is a flat tip or a D-shaped tip, and the axial moving groove is a flat groove or a D-shaped groove adapted to the telescopic head.

3. The LED display device with the highly effective installation according to claim 1, wherein both ends of relative sides of the display screens are fixed with the motor screw structure, and both ends of the relative sides are fixed with the nut structure.

4. The LED display device with the highly effective installation according to claim 1, wherein the deceleration motor, the mounting sleeve, and the mounting plate are all fixed inside the display screen by screws.

5. The LED display device with the highly effective installation according to claim 1, wherein the deceleration motor is electrically connected via a power cord with a 12V DC power supply for the display screen.

6. The LED display device with the highly effective installation according to claim 1, wherein the deceleration motor comprises a 12V motor and a reducer connected to an output end of the 12V motor, and the output end connected to the reducer is connected to the output shaft.

* * * * *